(12) United States Patent
Chen (10) Patent No.: US 10,986,737 B2
(45) Date of Patent: Apr. 20, 2021

(54) METHOD OF RESTRICTING MICRO DEVICE ON CONDUCTIVE PAD

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

(*) Notice: Subject to any disclaimer, the term of this patent is extended or adjusted under 35 U.S.C. 154(b) by 173 days.

(21) Appl. No.: 16/367,276

(22) Filed: Mar. 28, 2019

(65) Prior Publication Data
US 2020/0315029 A1  Oct. 1, 2020

(51) Int. Cl.
| | | |
|---|---|---|
| H05K 3/30 | (2006.01) | |
| H05K 1/11 | (2006.01) | |
| H05K 1/18 | (2006.01) | |
| H01L 21/48 | (2006.01) | |
| H01L 23/00 | (2006.01) | |

(52) U.S. Cl.
CPC ............ H05K 3/305 (2013.01); H05K 1/111 (2013.01); H05K 1/181 (2013.01); *H01L 21/4846* (2013.01); *H01L 24/83* (2013.01); *H01L 2224/83895* (2013.01); *H01L 2224/83948* (2013.01); *H01L 2924/0105* (2013.01); *H01L 2924/01022* (2013.01); *H01L 2924/01029* (2013.01); *H01L 2924/01049* (2013.01)

(58) Field of Classification Search
CPC .... H05K 1/111; H05K 1/181; H01L 21/4846; H01L 24/83; H01L 2224/83895; H01L 2224/83948; H01L 2924/01022; H01L 2924/01029; H01L 2924/01049; H01L 2924/0105

See application file for complete search history.

(56) References Cited

U.S. PATENT DOCUMENTS

| | | | |
|---|---|---|---|
| 5,111,279 A | 5/1992 | Pasch et al. | |
| 5,767,580 A | 6/1998 | Rostoker | |
| 2005/0194605 A1* | 9/2005 | Shelton | H01L 33/62 257/99 |
| 2005/0258438 A1* | 11/2005 | Arik | F21V 29/51 257/88 |
| 2010/0123163 A1 | 5/2010 | Ohtorii et al. | |
| 2012/0153317 A1* | 6/2012 | Emerson | G02F 1/133603 257/89 |
| 2015/0179605 A1* | 6/2015 | Dubey | H01L 24/33 257/777 |
| 2017/0221856 A1* | 8/2017 | Yamauchi | H01L 21/187 |
| 2019/0252232 A1* | 8/2019 | Chen | H01L 21/02513 |

* cited by examiner

*Primary Examiner* — Vishal I Patel
(74) *Attorney, Agent, or Firm* — CKC & Partners Co., LLC (57) ABSTRACT

A method of restricting a micro device on a conductive pad is provided. The method includes: forming the conductive pad having a first lateral length on a substrate; forming a liquid layer on the conductive pad; and placing the micro device having a second lateral length over the conductive pad such that the micro device is in contact with the liquid layer and is gripped by a capillary force produced by the liquid layer between the micro device and the conductive pad, the micro device comprising an electrode facing the conductive pad, wherein the first lateral length is less than or equal to twice of the second lateral length.

12 Claims, 14 Drawing Sheets

100

```
┌─────────────────────────────────────────────────────────────┐
│ forming a conductive pad having a first lateral length on a │──110
│ substrate                                                    │
└─────────────────────────────────────────────────────────────┘
                              │
                              ▼
┌─────────────────────────────────────────────────────────────┐
│   forming a liquid layer on the conductive pad              │──120
└─────────────────────────────────────────────────────────────┘
                              │
                              ▼
┌─────────────────────────────────────────────────────────────┐
│   placing a micro device having a second lateral length     │
│   over the conductive pad, and the first lateral length     │──130
│   being less than or equal to twice of the second lateral   │
│   length.                                                    │
└─────────────────────────────────────────────────────────────┘
```

METHOD OF RESTRICTING MICRO DEVICE ON CONDUCTIVE PAD

BACKGROUND

Field of Invention

The present disclosure relates to a method of restricting a position of a device during fabrication processes.

Description of Related Art

The statements in this section merely provide background information related to the present disclosure and do not necessarily constitute prior art.

In recent years, micro devices have become popular in various applications. As a size of one micro device goes down, the precision of a position of the micro device on a substrate becomes an important issue during fabrication processes.

SUMMARY

According to some embodiments of the present disclosure, a method of restricting a micro device on a conductive pad is provided. The method includes: forming the conductive pad having a first lateral length on a substrate; forming a liquid layer on the conductive pad; and placing the micro device having a second lateral length over the conductive pad such that the micro device is in contact with the liquid layer and is gripped by a capillary force produced by the liquid layer between the micro device and the conductive pad, the micro device comprising an electrode facing the conductive pad, wherein the first lateral length is less than or equal to twice of the second lateral length.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 1:
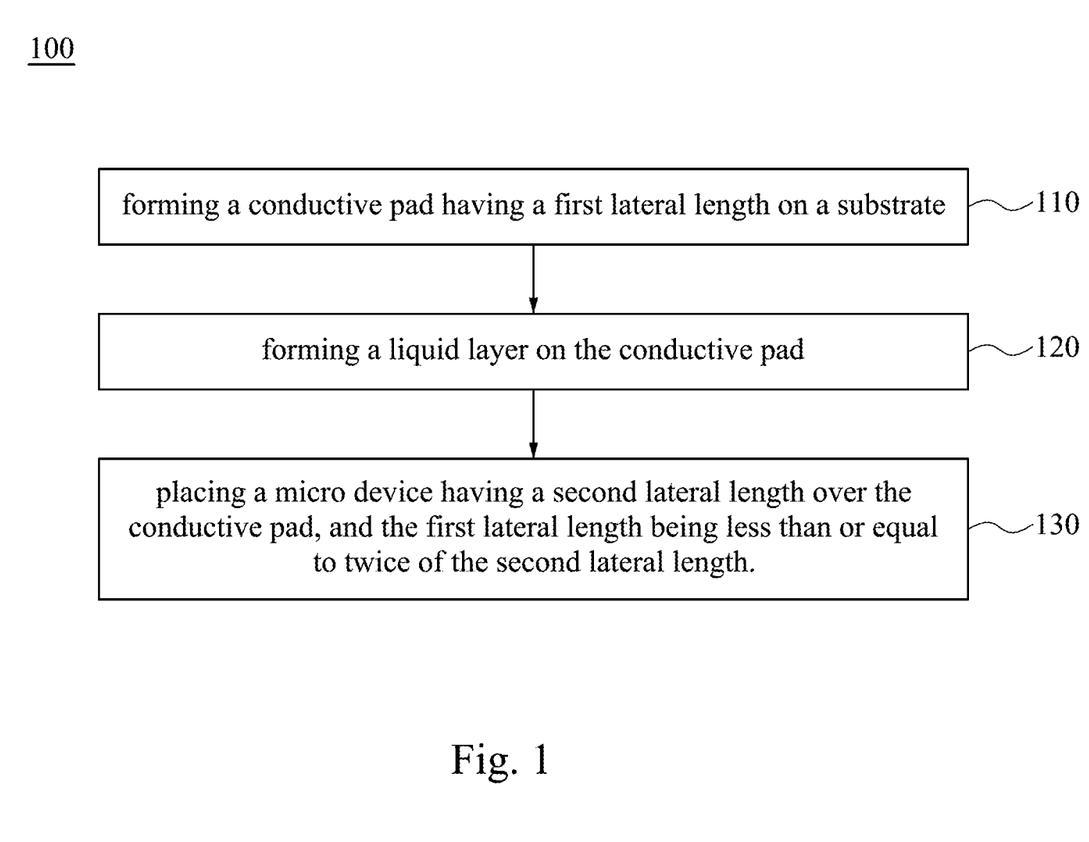
FIG. 1 is a schematic flow chart of a method of restricting a micro device on a conductive pad according to some embodiments of the present disclosure.
Figure 2A:
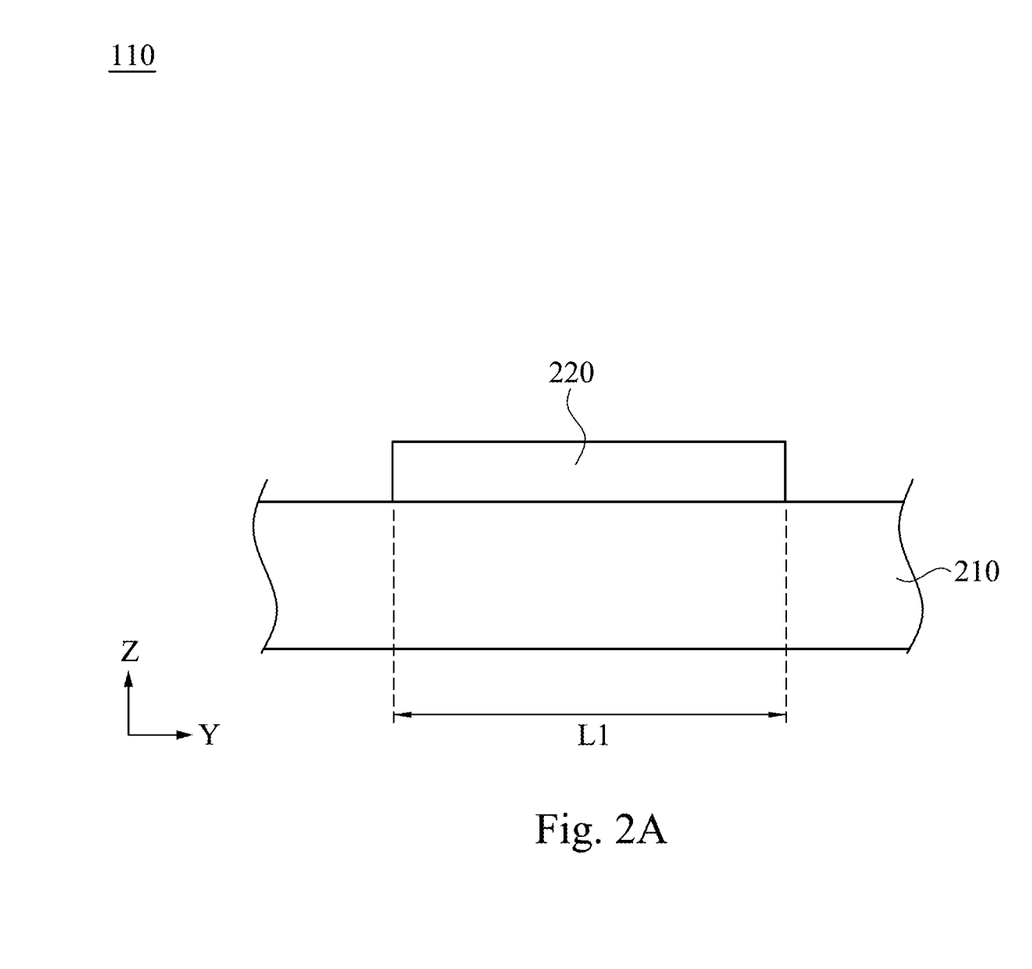
FIG. 2A is a schematic cross-sectional view of an intermediate stage of the method according to some embodiments of the present disclosure.
Figure 2B:
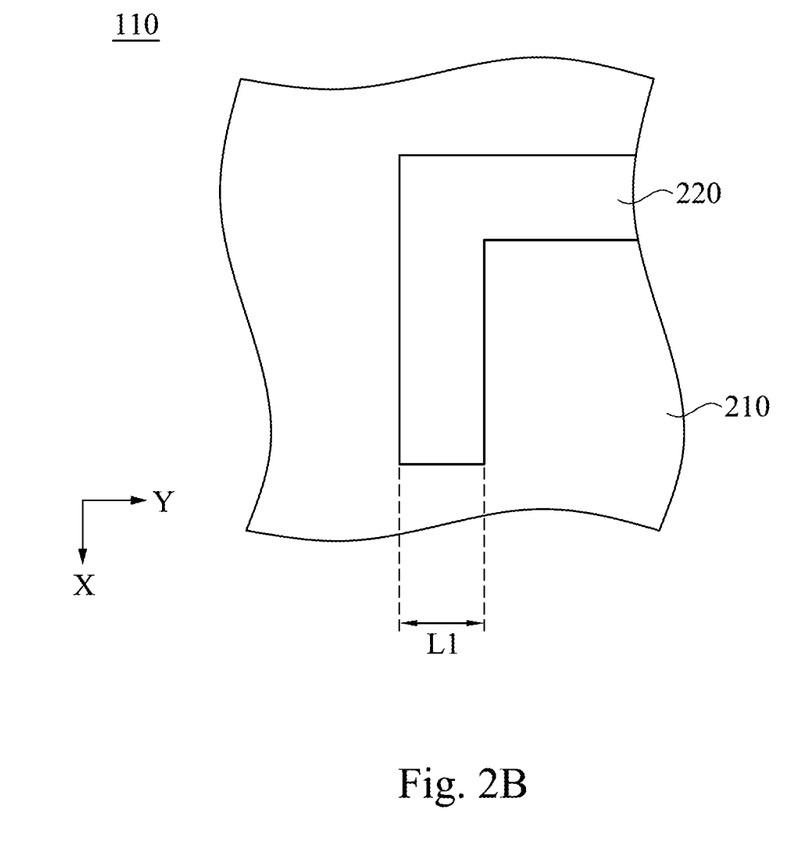
FIG. 2B is a schematic top view of an intermediate stage of the method according to some embodiments of the present disclosure.
Figure 3:
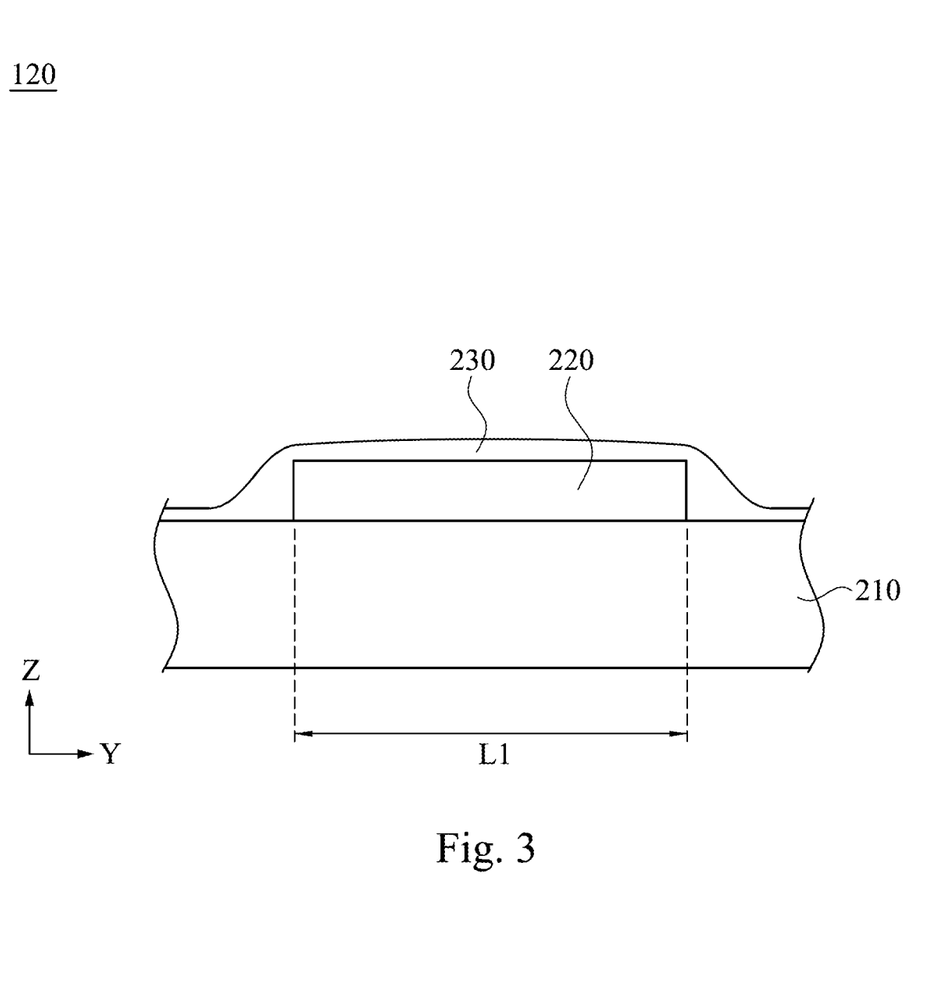
FIG. 3 is a schematic cross-sectional view of an intermediate stage of the method according to some embodiments of the present disclosure.
Figure 4A:
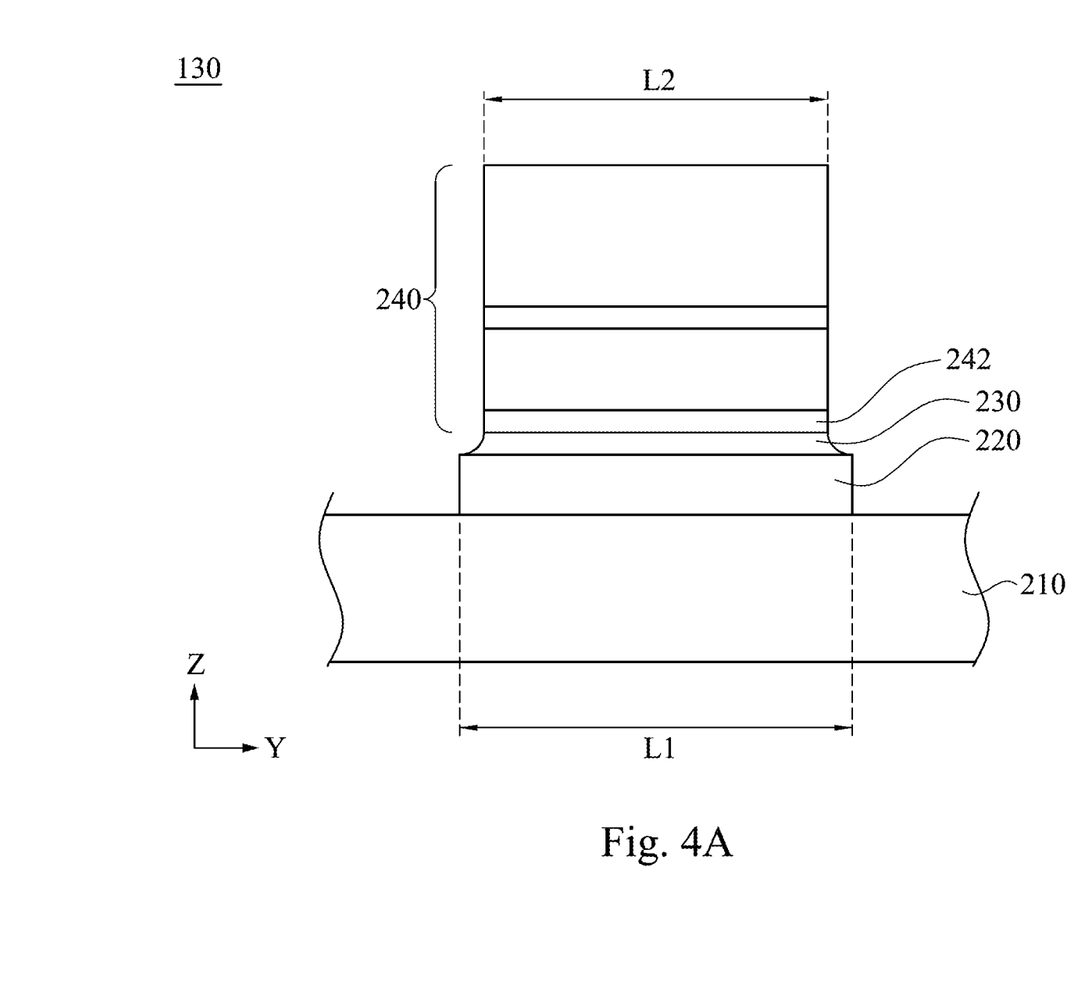
FIG. 4A is a schematic cross-sectional view of an intermediate stage of the method according to some embodiments of the present disclosure.
Figure 4B:
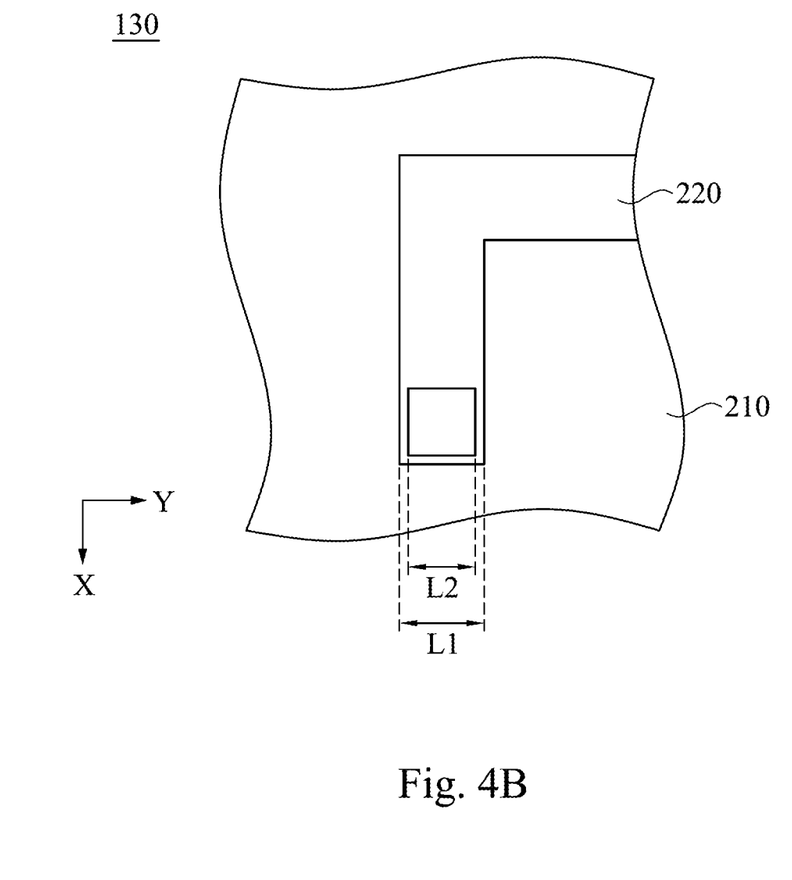
FIG. 4B is a schematic top view of an intermediate stage of the method according to some embodiments of the present disclosure.

Reference is made to FIGS. 1 to 4B. FIG. 1 is a schematic flow chart of a method 100 of restricting a micro device on a conductive pad according to some embodiments of the present disclosure. FIGS. 2A, 3, and 4A are schematic cross-sectional views of intermediate stages of the method 100 according to some embodiments of the present disclosure. FIGS. 2B and 4B are schematic top views of intermediate stages of the method 100 according to some embodiments of the present disclosure. In some embodiments, the method 100 of restricting a micro device on a conductive pad is provided. The method 100 begins with an operation 110 in which a conductive pad 220 having a first lateral length L1 is formed on a substrate 210 (also referred to FIGS. 2A and 2B). The method 100 continues with an operation 120 in which a liquid layer 230 is formed on the conductive pad 220 (also referred to FIG. 3). The method 100 continues with an operation 130 in which a micro device 240 having a second lateral length L2 is placed over the conductive pad 220 (also referred to FIGS. 4A and 4B). The lateral length is measured parallel to an X-Y plane defined by an X direction and a Y direction as shown in the above figures and is perpendicular to a thickness direction (i.e., a Z direction).

Reference is made to FIG. 3 in which the liquid layer 230 is formed on the conductive pad 220. In some embodiments, the liquid layer 230 includes water. The liquid layer 230 can be formed by at least two methods as described in the following embodiments. In some embodiments, a temperature of the conductive pad 220 in an environment including a vapor is adjusted to a selected temperature point such that a part of the vapor is condensed to form the liquid layer 230 on the conductive pad 220. Said selected temperature point can be a dew point. In some other embodiments, a gas is locally showered on the conductive pad 220 and a portion of the substrate 210 such that a part of the gas is condensed to form the liquid layer 230 on the conductive pad. In some embodiments, the gas has a water vapor pressure higher than an ambient water vapor pressure, so as to spontaneously form the liquid layer 230 after showering. In some embodiments, the gas consists essentially of water and nitrogen, but should not completely exclude other compounds or elements. The gas can also form the liquid layer 230 after adjusting the temperature of the conductive pad to the dew point when the water vapor pressure of the gas initial showered is lower than the ambient water vapor pressure.

Reference is made to FIGS. 4A and 4B in which the micro device 240 having the second lateral length L2 is placed over the conductive pad 220, such that the micro device 240 is in contact with the liquid layer 230 and is gripped by a capillary force produced by the liquid layer 230 between the micro device 240 and the conductive pad 220. The micro device 240 has an electrode 242 facing the conductive pad 220. In some embodiments, a thickness of the liquid layer 230 is less than a thickness of the micro device 240 when the micro device 240 is gripped by the capillary force, such that the micro device 240 can be gripped by the liquid layer 230 and can be substantially held in a position within a controllable region on the conductive pad 220. In some embodiments, the first lateral length L1 is less than or equal to twice of the second lateral length L2. In some embodiments, the first lateral length L1 is greater than or equal to two-thirds of the second lateral length L2. With the restriction of length relations between the first lateral length L1 and the second lateral length L2, the micro device 240 has a higher chance to be held in a position within the controllable region on the conductive pad 220. Said benefit is particularly significant when the liquid layer 230 mentioned above is present for binding the micro device 240 to the conductive pad 220. Specifically, with the restriction of length relations between the first lateral length L1 and the second lateral length L2, a part of the liquid layer 230 present on the conductive pad 220 tends to gather within the lateral length L1, such that when the micro device 240 is gripped by the liquid layer 230, said part of the liquid layer 230 restricts the position of the micro device 240. Said benefit is significant and useful when the lateral length L2 is less than or equal to about 100 μm. In macroscopic cases such as a lateral length of a device is greater than or equal to 1 mm, the liquid layer 230 do not help to firmly bind the device to a target pad due to that a ratio between an outer periphery and an area of a contact portion is too small for the liquid layer 230 to grip the device, and said binding assisted by the liquid layer 230 do not work in the macroscopic cases.

Figure 5:
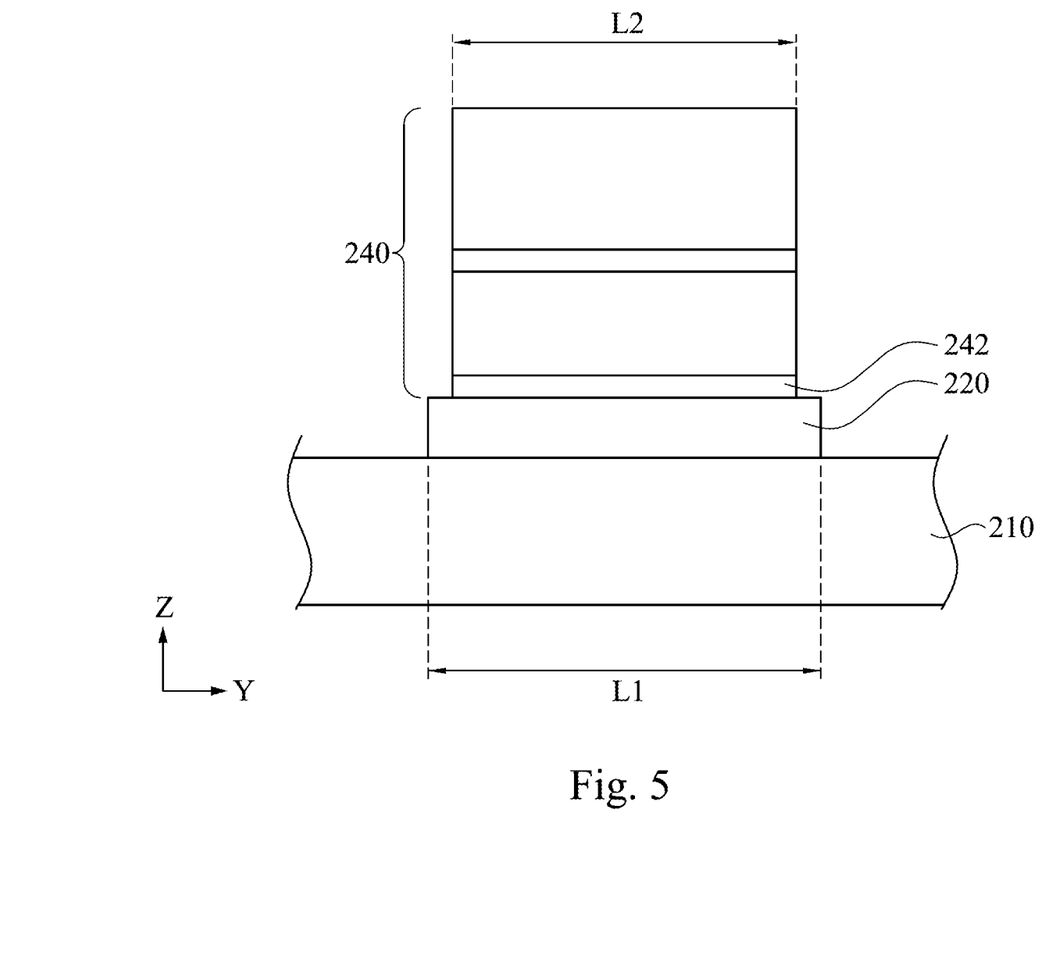
FIG. 5 is a schematic cross-sectional view of an intermediate stage of the method according to some embodiments of the present disclosure.

Reference is made to FIG. 5. FIG. 5 is a schematic cross-sectional view of an intermediate stage of the method 100 according to some embodiments of the present disclosure. In some embodiments, the liquid layer 230 is evaporated after the micro device 240 is gripped by the capillary force, such that the electrode 242 of the micro device 240 is stuck to the conductive pad 220. In other words, the electrode 242 is bound to and is in electrical contact with the conductive pad 220.

In some other embodiments, the liquid layer 230 is first formed on the substrate 210, then the micro device 240 is placed over the conductive pad 220 and is gripped by the liquid layer 230. After that, another liquid layer is formed on the substrate 210, and followed by an evaporation of liquids from the liquid layer 230 and said another liquid layer, so as to bind the micro device 240 on the conductive pad 220 more firmly and precisely compared to embodiments with single liquid layer 230.

Figure 6A:
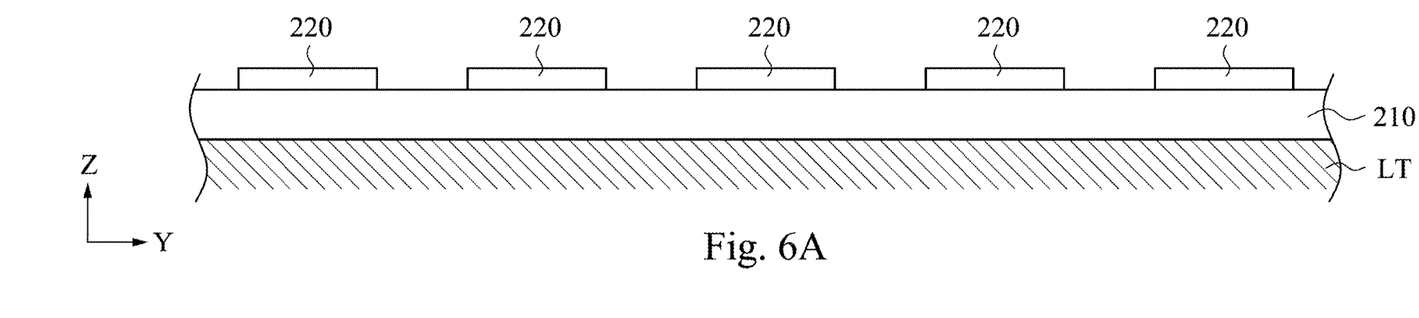
FIG. 6A is a schematic cross-sectional view of an intermediate stage of the method for binding a plurality of micro devices according to some embodiments of the present disclosure.
Figure 6B:
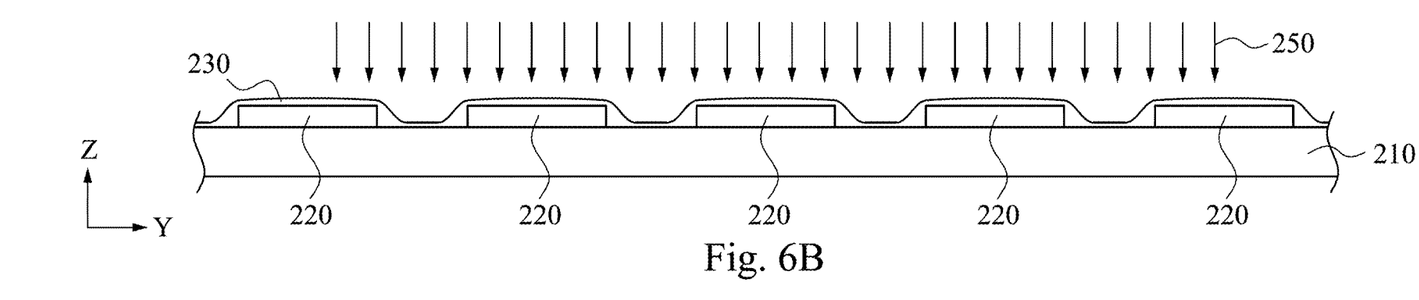
FIG. 6B is a schematic cross-sectional view of an intermediate stage of the method for binding a plurality of micro devices according to some embodiments of the present disclosure.
Figure 6C:
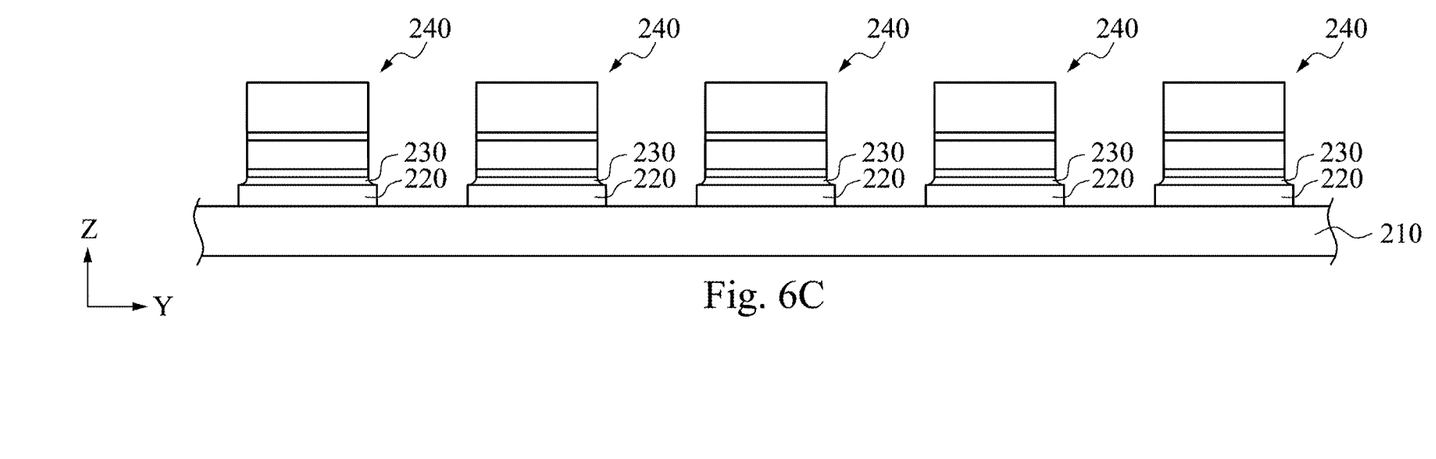
FIG. 6C is a schematic cross-sectional view of an intermediate stage of the method for binding a plurality of micro devices according to some embodiments of the present disclosure.

Reference is made to FIGS. 6A to 6C. FIGS. 6A to 6C are schematic cross-sectional views of intermediate stages of the method 100 for binding a plurality of micro devices 240 according to some embodiments of the present disclosure. FIGS. 6A to 6C can be viewed as a complete embodiment for binding the plurality of micro devices 240 to the conductive pads 220. Embodiments illustrated by FIGS. 6A to 6C take showering method as an exemplification, but should not be limited thereto. A cooling device LT is used to lower the temperature of the substrate 210 and the conductive pads 220 (as referred to FIG. 6A). The cooling device LT can be a cooling plate, but should not be limited thereto. The cooling device LT can also be replaced by heating devices in other practical applications. In some embodiments, the gas 250 is showered on the conductive pads 220 and the substrate 210 to form the liquid layer 230 where micro devices 240 are to be placed on (as referred to FIG. 6B). After that, a plurality of the micro devices 240 are placed over the conductive pads 220 and in contact with the liquid layer 230 (as referred to FIG. 6C).

Figure 7A:
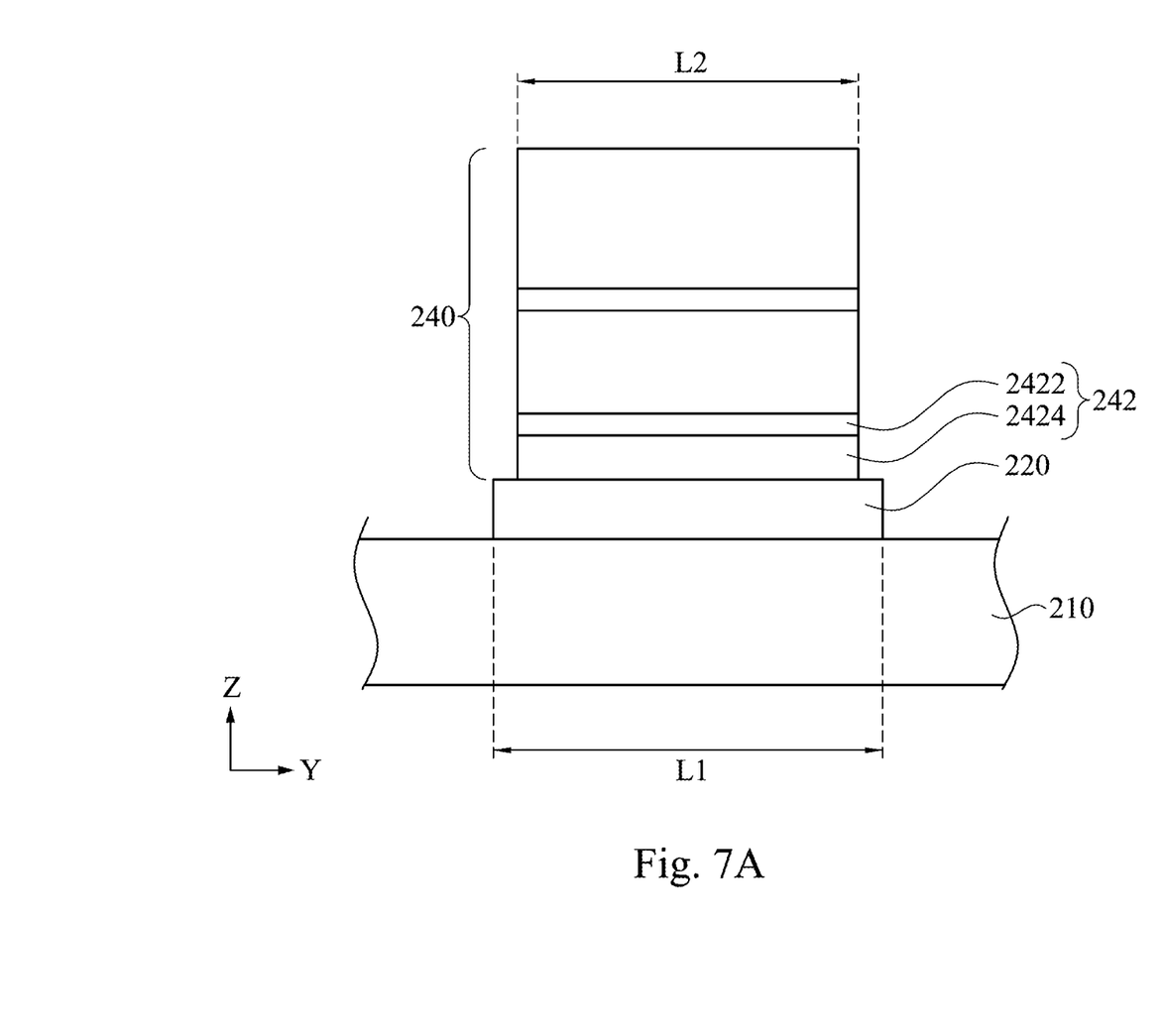
FIG. 7A is a schematic cross-sectional view of the micro device on the conductive pad according to some embodiments of the present disclosure.
Figure 7B:
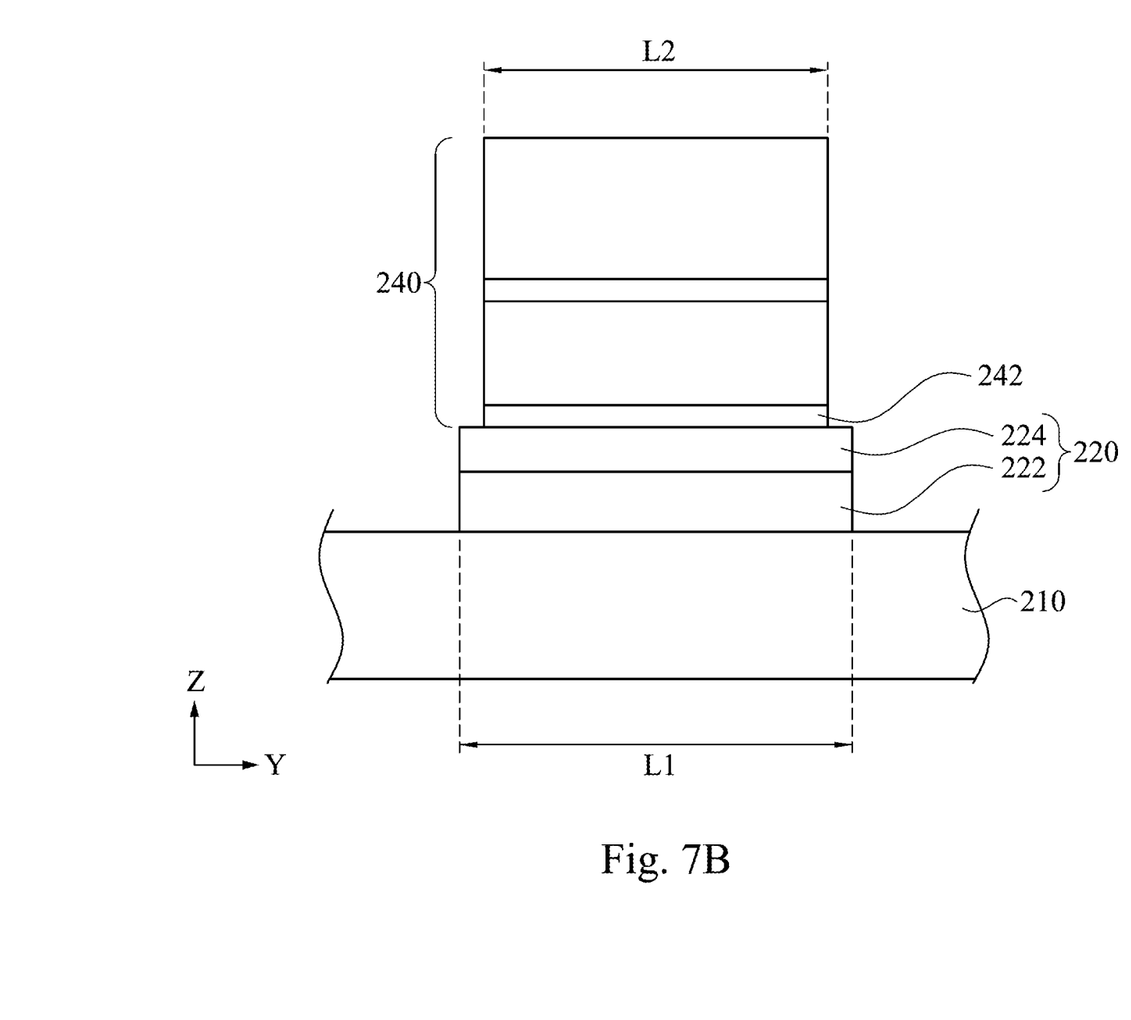
FIG. 7B is a schematic cross-sectional view of the micro device on the conductive pad according to some embodiments of the present disclosure.

Reference is made to FIGS. 7A and 7B. FIGS. 7A and 7B are schematic cross-sectional views of the micro device 240 on the conductive pad 220 according to some embodiments of the present disclosure. In some embodiments, at least one of the conductive pad 220 and the electrode 242 of the micro device 240 includes a bonding material. Specifically, in some embodiments as illustrated by FIG. 7A, the electrode 242 of the micro device 240 includes a metal electrode 2422 and a bonding material 2424 present on the metal electrode 2422 and in contact with the conductive pad 220 after the electrode 242 is bound to and is in electrical contact with the conductive pad 220. In some embodiments as illustrated by FIG. 7B, the conductive pad 220 includes a metal pad 222 and a bonding material 224. The metal pad 222 is present on the substrate 210, the bonding material 224 is present on the metal pad 222, and the bonding material 224 is in contact with the electrode 242. At least one of the bonding materials 2424 and 224 includes a solder material, such as tin (Sn), indium (In), or a combination thereof, and should not be limited thereto. At least one of the metal electrode 2422 and the metal pad 222 includes copper (Cu), titanium (Ti), or a combination thereof. Note that in the present embodiments the electrode 242 is bound to the conductive pad 220 with the temperature of the electrode 242 and the conductive pad 220 lower than the melting point of the bonding materials 2424 and 224.

Figure 8:
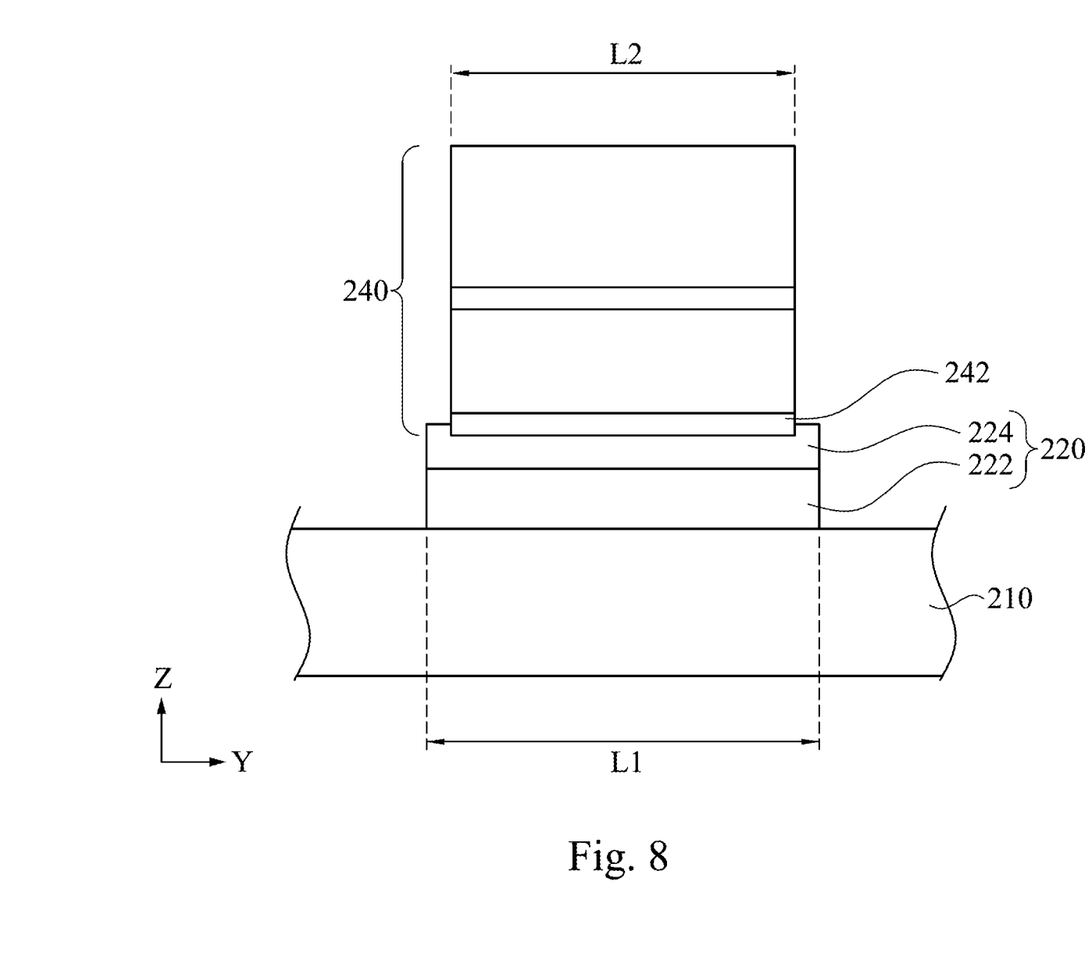
FIG. 8 is a schematic cross-sectional view of the micro device on the conductive pad according to some embodiments of the present disclosure.

Reference is made to FIG. 8. FIG. 8 is a schematic cross-sectional view of the micro device 240 on the conductive pad 220 according to some embodiments of the present disclosure. In some embodiments, after the liquid layer 230 is evaporated, the temperature of the conductive pad 220 is further raised to be above a melting point of the bonding material 224 (or bonding material 2424 in other embodiments). FIG. 8 shows a resulting structure after raising said temperature to be above said melting point. In some other embodiments, after the liquid layer 230 is evaporated, the temperature of the conductive pad 220 is further raised to be below a melting point of the bonding material 224 (or bonding material 2424). Said "below" means a temperature point below the melting point but enough to induce an interstitial diffusion between the bonding material 224 and the electrode 242 (or between the bonding material 2424 and the conductive pad 220) such that the micro device 240 is bonded to and is in electrical contact with the conductive pad 220. In such cases, the micro device 240 can be better protected due to lower temperature. Besides, since there is no "melting", a position precision of the micro device 240 on the conductive pad 220 is further enhanced.

Figure 9:
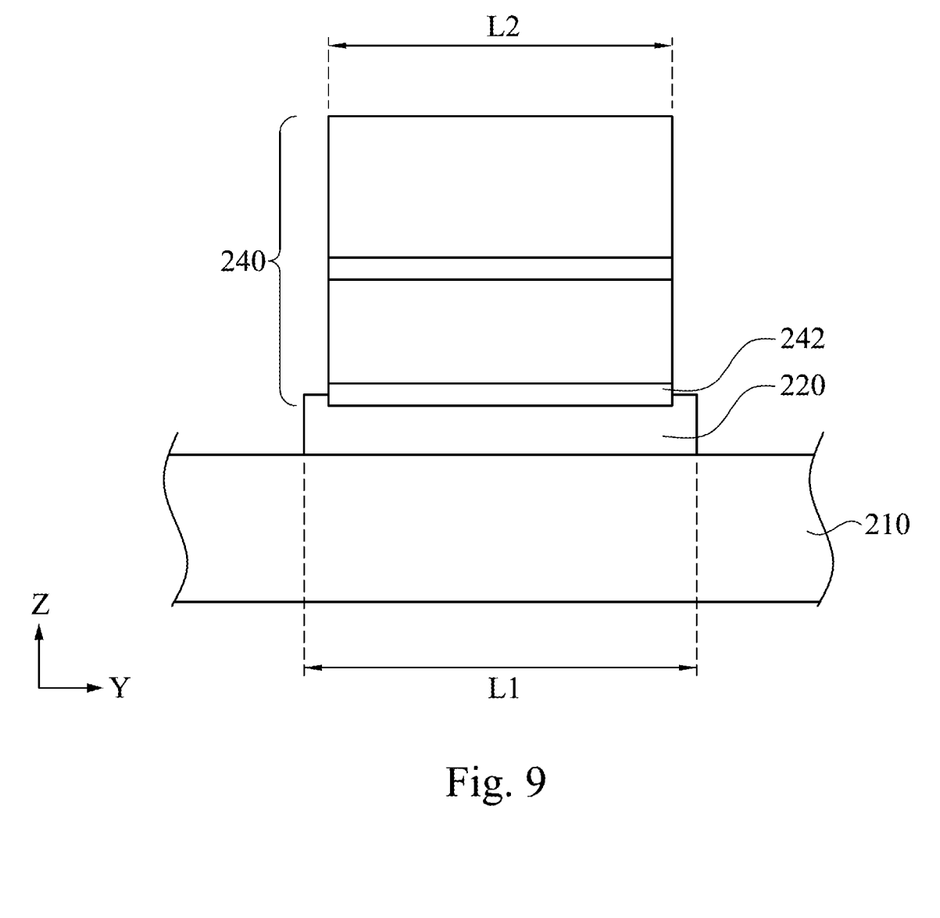
FIG. 9 is a schematic cross-sectional view of the micro device on the conductive pad according to some embodiments of the present disclosure.

Reference is made to FIG. 9. FIG. 9 is a schematic cross-sectional view of the micro device 240 on the conductive pad 220 according to some embodiments of the present disclosure. In some embodiments, after the liquid layer 230 is evaporated, the temperature of the conductive pad 220 is further raised to be above a eutectic point of the conductive pad 220 and the electrode 242 of the micro device 240. FIG. 9 shows a resulting structure after raising said temperature to be above said eutectic point.

Figure 10A:
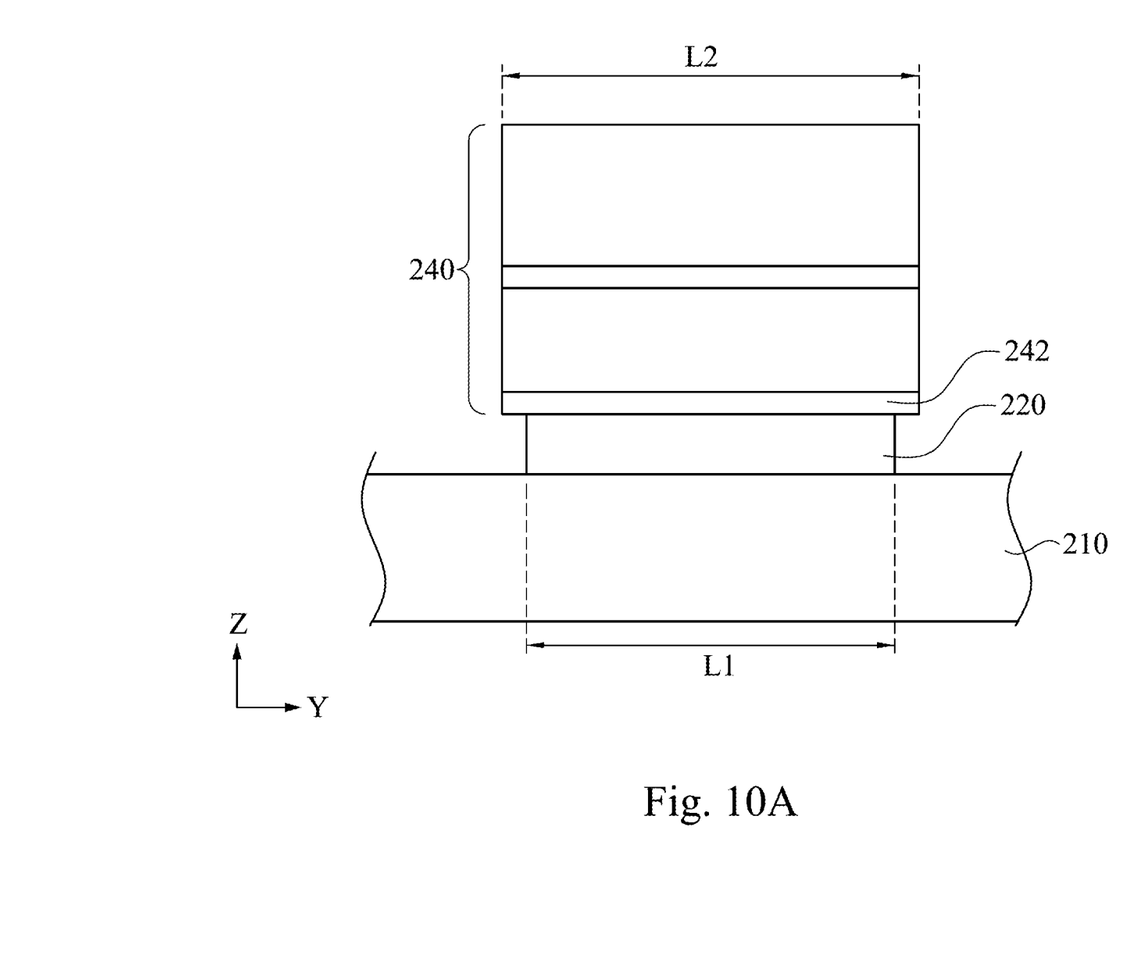
FIG. 10A is a schematic cross-sectional view of the micro device on the conductive pad according to some embodiments of the present disclosure.
Figure 10B:
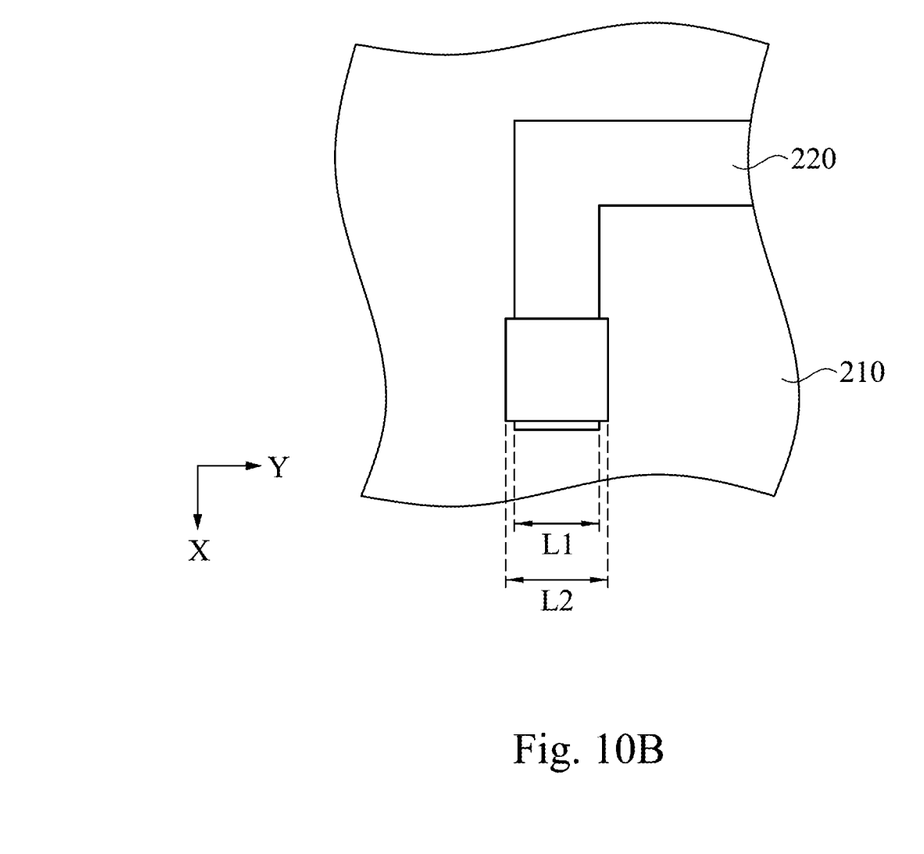
FIG. 10B is a schematic top view of the micro device on the conductive pad according to some embodiments of the present disclosure.

Reference is made to FIGS. 10A and 10B. FIG. 10A is a schematic cross-sectional view of the micro device 240 on the conductive pad 220 according to some embodiments of the present disclosure. FIG. 10B is a schematic top view of the micro device 240 on the conductive pad 220 according to the embodiments as illustrated by FIG. 10A. A difference between the embodiments illustrated by FIGS. 10A and 10B and the embodiments illustrated by FIGS. 4A and 4B is that in FIGS. 4A and 4B the first lateral length L1 is slightly greater than the second lateral length L2, while in FIGS. 10A and 10B the second lateral length L2 is slightly greater than the first lateral length L1. It should be noted that in both cases the conditions of "the first lateral length L1 is less than or equal to twice of the second lateral length L2" and "the first lateral length L1 is greater than or equal to two-thirds of the second lateral length L2" are satisfied.

In summary, the embodiments of the present disclosure provide a method of restricting a micro device on a conductive pad. Length relations between a lateral length of the micro device and a lateral length of the conductive pad is present to improve a precision of a position when binding the micro device to the conductive pad during manufacturing processes when the lateral length of the micro device is less than or equal to about 100 μm.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of restricting a micro device on a conductive pad, comprising:
   forming the conductive pad having a first lateral length on a substrate;
   forming a liquid layer on the conductive pad; and
   placing the micro device having a second lateral length less than or equal to about 100 μm over the conductive pad such that the micro device is in contact with the liquid layer and is gripped by a capillary force produced by the liquid layer between the micro device and the conductive pad, the micro device comprising an electrode facing the conductive pad, wherein the first lateral length is less than or equal to twice of the second lateral length.

2. The method of claim 1, wherein forming the liquid layer further comprises:
   adjusting a temperature of the conductive pad in an environment comprising a vapor to a selected temperature point such that a part of the vapor is condensed to form the liquid layer on the conductive pad.

3. The method of claim 2, wherein the selected temperature point is a dew point.

4. The method of claim 1, wherein forming the liquid layer further comprises:
   locally showering a gas on the conductive pad and a portion of the substrate such that a part of the gas is condensed to form a liquid layer on the conductive pad, wherein the gas has a water vapor pressure higher than an ambient water vapor pressure.

5. The method of claim 1, wherein the liquid layer comprises water.

6. The method of claim 1, further comprising:
   evaporating the liquid layer such that the electrode of the micro device is bound to and is in electrical contact with the conductive pad.

7. The method of claim 6, further comprising:
   raising a temperature of the conductive pad to be above a melting point of the conductive pad or the electrode after evaporating the liquid layer.

8. The method of claim 6, further comprising:
   raising a temperature of the conductive pad to be below a melting point of the conductive pad or the electrode after evaporating the liquid layer.

9. The method of claim 6, further comprising:
   raising a temperature of the conductive pad to be above a of the conductive pad and the electrode after evaporating the liquid layer.

10. The method of claim 1, wherein at least one of the conductive pad and the electrode of the micro device comprises a bonding material.

11. The method of claim 1, wherein a thickness of the liquid layer is less than a thickness of the micro device when the micro device is gripped by the capillary force.

12. The method of claim 1, wherein the first lateral length is greater than or equal to two-thirds of the second lateral length.

* * * * *